US010559354B2

(12) United States Patent
Jeong et al.

(10) Patent No.: US 10,559,354 B2
(45) Date of Patent: Feb. 11, 2020

(54) MEMORY SYSTEM

(71) Applicant: SK hynix Inc., Gyeonggi-do (KR)

(72) Inventors: Seung-Gyu Jeong, Gyeonggi-do (KR);
Jung-Hyun Kwon, Seoul (KR);
Do-Sun Hong, Gyeonggi-do (KR);
Won-Gyu Shin, Seoul (KR)

(73) Assignee: SK hynix Inc., Gyeonggi-do (KR)

( * ) Notice: Subject to any disclaimer, the term of this patent is extended or adjusted under 35 U.S.C. 154(b) by 0 days.

(21) Appl. No.: 16/007,538

(22) Filed: Jun. 13, 2018

(65) Prior Publication Data

US 2019/0147949 A1    May 16, 2019

(30) Foreign Application Priority Data

Nov. 13, 2017  (KR) ......................... 10-2017-0150558

(51) Int. Cl.
*G11C 8/10*  (2006.01)
*G11C 13/00*  (2006.01)

(52) U.S. Cl.
CPC .............. *G11C 13/003* (2013.01); *G11C 8/10* (2013.01); *G11C 13/0026* (2013.01); *G11C 13/0028* (2013.01); *G11C 2213/72* (2013.01)

(58) Field of Classification Search
CPC ........................................................ G11C 8/10
USPC ............................................. 365/230.06, 236
See application file for complete search history.

(56) References Cited

U.S. PATENT DOCUMENTS

| 6,094,701 | A | 7/2000 | Muchizuki et al. |
| 6,191,997 | B1 | 2/2001 | Son et al. |
| 9,837,133 | B1 * | 12/2017 | Pedersen .................. G11C 8/04 |

FOREIGN PATENT DOCUMENTS

KR    10-2019-0053646    5/2019

* cited by examiner

*Primary Examiner* — Son L Mai
(74) *Attorney, Agent, or Firm* — IP & T Group LLP (57) ABSTRACT

A memory system includes: a first cell array including a plurality of memory cells; and a second cell array including a plurality of memory cells; and an address operation circuit suitable for generating a first cell array address, the first cell array address used for accessing at least one first cell in the first cell array, by adding a first value to an address, and generating a second cell array address, the second cell array address used for accessing at least one second cell in the second cell array, by adding a second value to the address.

20 Claims, 5 Drawing Sheets

MEMORY SYSTEM

CROSS-REFERENCE TO RELATED APPLICATIONS

The present application claims priority of Korean Patent Application No. 10-2017-0150558, filed on Nov. 13, 2017, which is incorporated herein by reference in its entirety.

BACKGROUND

1. Field

Exemplary embodiments of the present invention relate to a memory system.

2. Description of the Related Art

Recently, academic researchers and the industry are developing next-generation memory devices for replacing Dynamic Random-Access Memories (DRAMs) and flash memories. Among the proposed next-generation memories is a resistive memory device using a variable resistance material, which is a material capable of switching between at least two different resistance states, as the resistance changes rapidly according to an applied bias.

Typical examples of a resistive memory device include a Phase-Change Random Access Memory (PCRAM), a Resistive Random-Access Memory (RRAM), a Magnetic Random-Access Memory (MRAM), a Ferroelectric Random-Access Memory (FRAM) and the like.

A resistive memory device may form a memory cell array in a cross-point array structure. The cross-point array structure is a structure where a plurality of lower electrodes (e.g., a plurality of row lines (word lines)) and a plurality of upper electrodes (e.g., a plurality of column lines (bit lines)) intersect with each other and a memory cell is disposed at each of the cross-points. The memory cell of a resistive memory device may include a variable resistance device and a selection device serially coupled.

SUMMARY

Embodiments of the present invention are directed to a memory system including plural cell arrays of which different positioned cells are accessed together by a single command.

In accordance with an embodiment of the present invention, a memory system includes: a first cell array including a plurality of memory cells; and a second cell array including a plurality of memory cells; and an address operation circuit suitable for generating a first cell array address, the first cell array address used for accessing at least one first cell in the first cell array, by adding a first value to an address, and generating a second cell array address, the second cell array address used for accessing at least one second cell in the second cell array, by adding a second value to the address.

In accordance with another embodiment of the present invention, a memory system includes: a first group that includes two or more cell arrays; a second group that includes two or more cell arrays; and an address operation circuit suitable for generating a first group address for accessing at least one first cell in the first group, by adding a first value to an address, and generating a second group address for accessing at least one second cell in the second group, by adding a second value to the address.

In accordance with another embodiment of the present invention, a memory system includes: at least one memory device including plural cell arrays; a controller suitable for performing a single operation on the at least one memory device for storing or outputting a multi-bit data, wherein the number of cell arrays in the at least one memory device is an integer multiple of the number of bits in the multi-bit data; and an address operation circuit suitable for converting a cell address entered with a command for the single transaction into different converted cell addresses and providing each converted cell addresses into each cell array.

BRIEF DESCRIPTION OF THE DRAWINGS

The description herein makes reference to the accompanying drawings wherein like reference numerals refer to like parts throughout the several views, and wherein.

DETAILED DESCRIPTION

Various examples of the disclosure of the present invention will be described below in more detail with reference to the accompanying drawings. It is noted, however, that the present invention may be embodied in different other forms and should not be construed as limited to the examples set forth herein. Rather, these examples are provided so that this disclosure will be thorough and complete, and will fully convey the scope of the invention to those skilled in the art.

It will be further understood that the terms "comprises," "comprising," "includes," and "including" when used in this specification, specify the presence of the stated elements and do not preclude the presence or addition of one or more other elements. Also, as used herein, the term "and/or" includes any and all combinations of one or more of the associated listed items.

In the following description, numerous specific details are set forth in order to provide a thorough understanding of the present invention. The present invention may be practiced without some or all these specific details. In other instances, well-known process structures and/or processes have not been described in detail in order not to unnecessarily obscure the present invention.

It is also noted, that in some instances, as would be apparent to those skilled in the relevant art, a feature or element described in connection with one embodiment may be used singly or in combination with other features or elements of another embodiment, unless otherwise specifically indicated.

Figure 1:
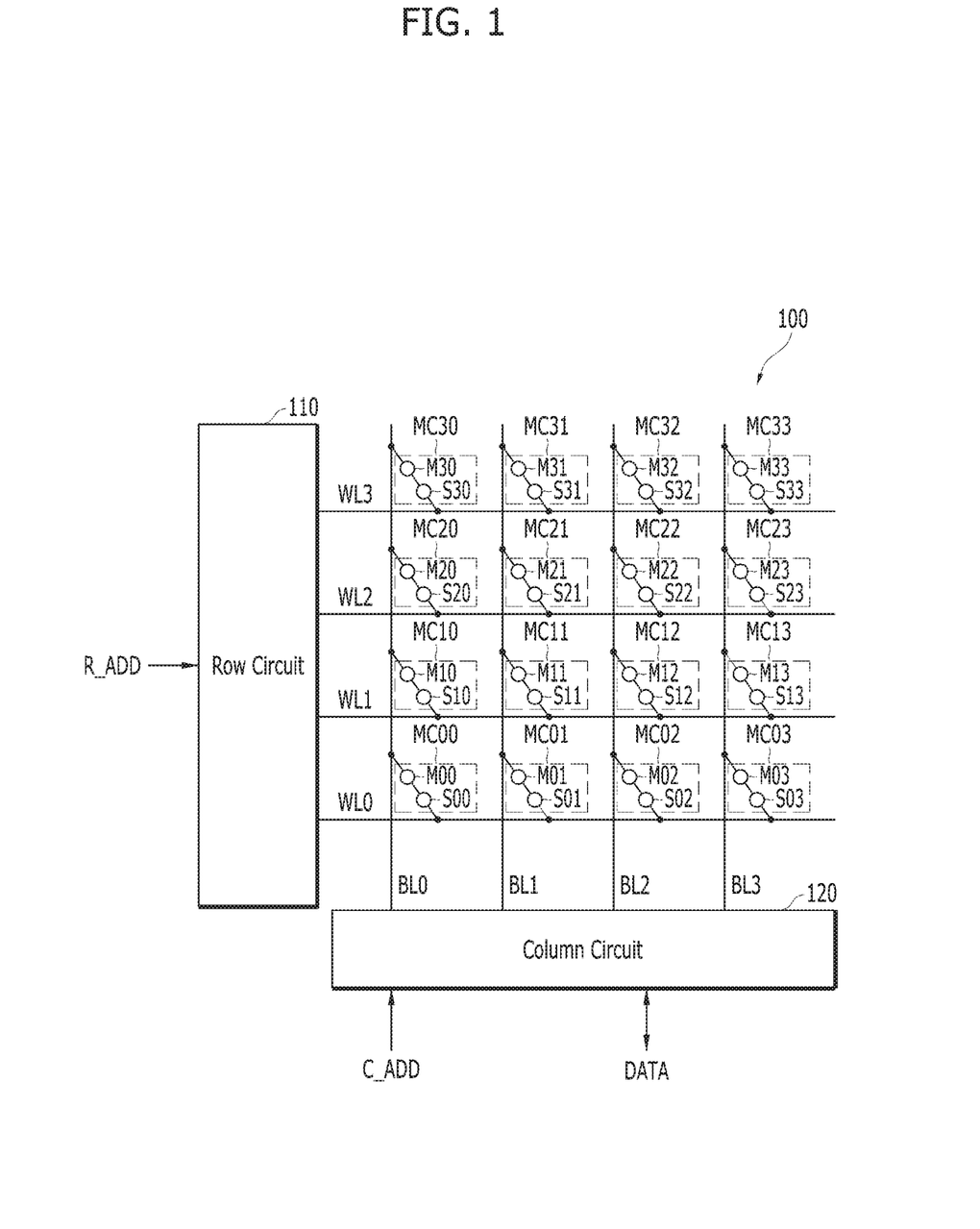
FIG. 1 is a block diagram illustrating a cell array coupled to a row circuit and a column circuit.

FIG. 1 is a block diagram illustrating a cell array 100. Referring to FIG. 1, the cell array 100 may include a plurality of word lines WL0, WL1, WL2, WL3 (which are also referred to as row lines), a plurality of bit lines BL0, BL1, BL2, BL3 (which are also referred to as column lines), and memory cells MC00 to MC33 formed at the cross-points between the word lines WL0 to WL3 and the bit lines BL0 to BL3. The word lines WL0 to WL3 and the bit lines BL0 to BL3 may be controlled by row circuit 110 and column circuit 120, respectively. The word lines WL0 to WL3 and the bit lines BL0 to BL3 may be relative names for distinguishing one from the other. In other words, the word lines WL0 to WL3 in the drawing may be referred to as bit lines, while the bit lines BL0 to BL3 in the drawing may be referred to as word lines.

The memory cells MC00 to MC33 may include resistive memory devices M00 to M33 and selection devices S00 to S33, respectively. The resistive memory devices M00 to M33 may have a high resistance state or a low resistance state according to stored data. The resistive memory devices M11 to M33 may be phase-change memory devices. The resistive memory devices M11 to M33 may have a low resistance state in a crystalline state. The resistive memory devices M00 to M33 may have a high resistance state in an amorphous state. The selection devices S00 to S33 may be turned on when the voltage level difference between both ends of a memory cell is large. The selection devices S00 to S33 may be turned off when the voltage level difference is small. In various examples, diodes and/or Ovonic Threshold Switch (OTS) elements may be used as the selection devices S00 to S33.

The row circuit 110 may select a word line corresponding to a row address R_ADD among the word lines WL0 to WL3. The column circuit 120 may select one-bit line corresponding to a column address C_ADD among the bit lines BL0 to BL3, and write (program) a data DATA in the selected memory cell through the selected bit line or read a data DATA from the selected memory cell. A memory cell positioned at a cross-point between the selected word line and the selected bit line may be the selected memory cell. By the way of example but not limitation, when the word line WL1 and the bit line BL2 are selected, the memory cell MC12 may be the selected memory cell.

During a read operation in the cell array 100, current may flow through the column circuit 120 followed by the selected bit line, followed by the selected memory cell, followed by the selected word line, followed by the row circuit 110. Since the memory cells MC13, MC22, MC21, MC20 are positioned on a path that the current flows when the selected memory cell is a memory cell MC23, a disturbance phenomenon may occur in the memory cells MC13, MC22, MC21, MC20 during the read operation of the memory cell MC23. When the selected memory cell is a memory cell MC02, since the memory cells MC01, MC00 are positioned on the path that the current flows, the disturb phenomenon may occur in the memory cells MC01, MC00 during the read operation of the memory cell MC02. In other words, the disturb phenomenon may occur in at least some of the memory cells which are closer to the row circuit 110 than the selected memory cell in each cell array, which correspond to a word line during a read operation, and at least some of the memory cells which are closer to the column circuit 120 than the selected memory cell among the memory cells, which correspond to a bit line selected during the read operation. Also, during a read operation, heat may be generated in the row circuit 110 and the column circuit 120. Memory cells which are closer to the row circuit 110 and the column circuit 120 may be more affected by the generated heat.

Figure 2:
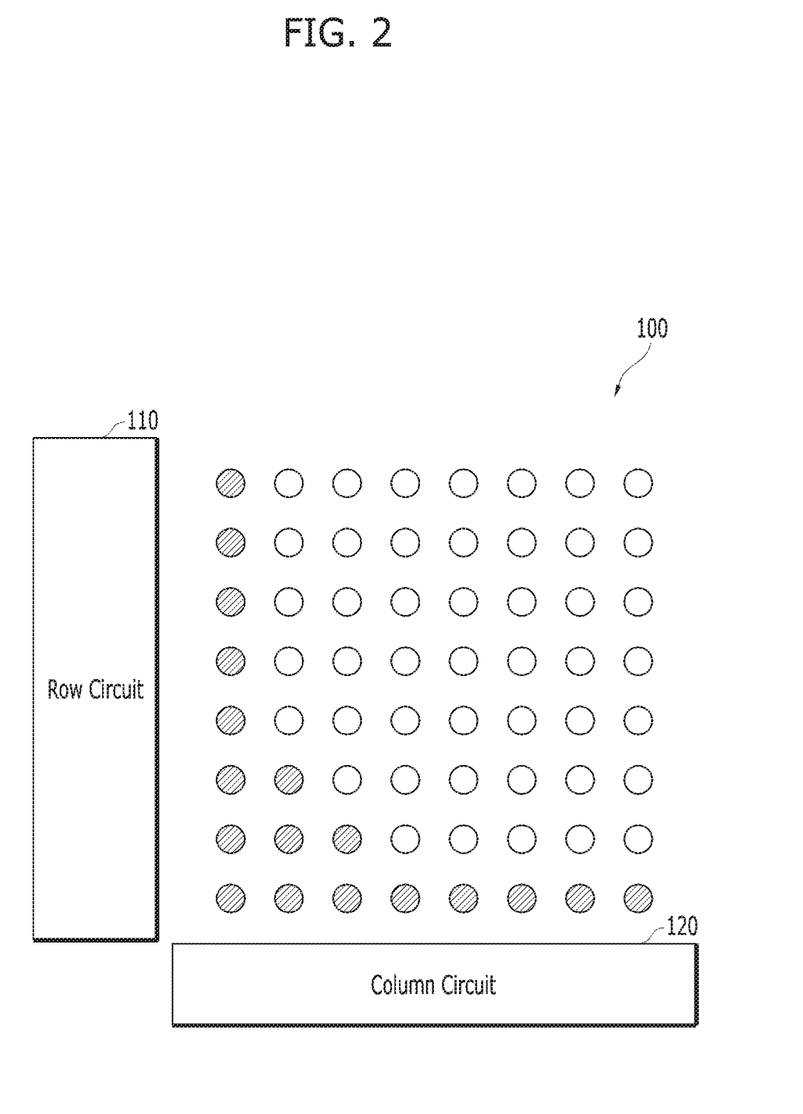
FIG. 2 shows memory cells (which are shaded) which are more likely to lose data due to a disturbance phenomenon in the cell array and/or heat generated in the row/column circuits.

In FIG. 2 the shaded memory cells denote memory cells that are more likely to lose data due to the heat generated in the row circuit 110 and the column circuit 120 and/or the disturbance phenomenon in the cell array 100. FIG. 2 exemplarily illustrates that the cell array includes 8×8 memory cells, i.e., 64 memory cells. In FIG. 2, the word lines and the bit lines are omitted for explanation convenience. It may be understood from FIG. 2 that, as a random read operation is repeated, the data of at least some of the memory cells which are closer to the row circuit 110 and/or the column circuit 120, that is, memory cells coupled with lower numbered word lines or bit lines, are more likely to be lost.

Figure 3:
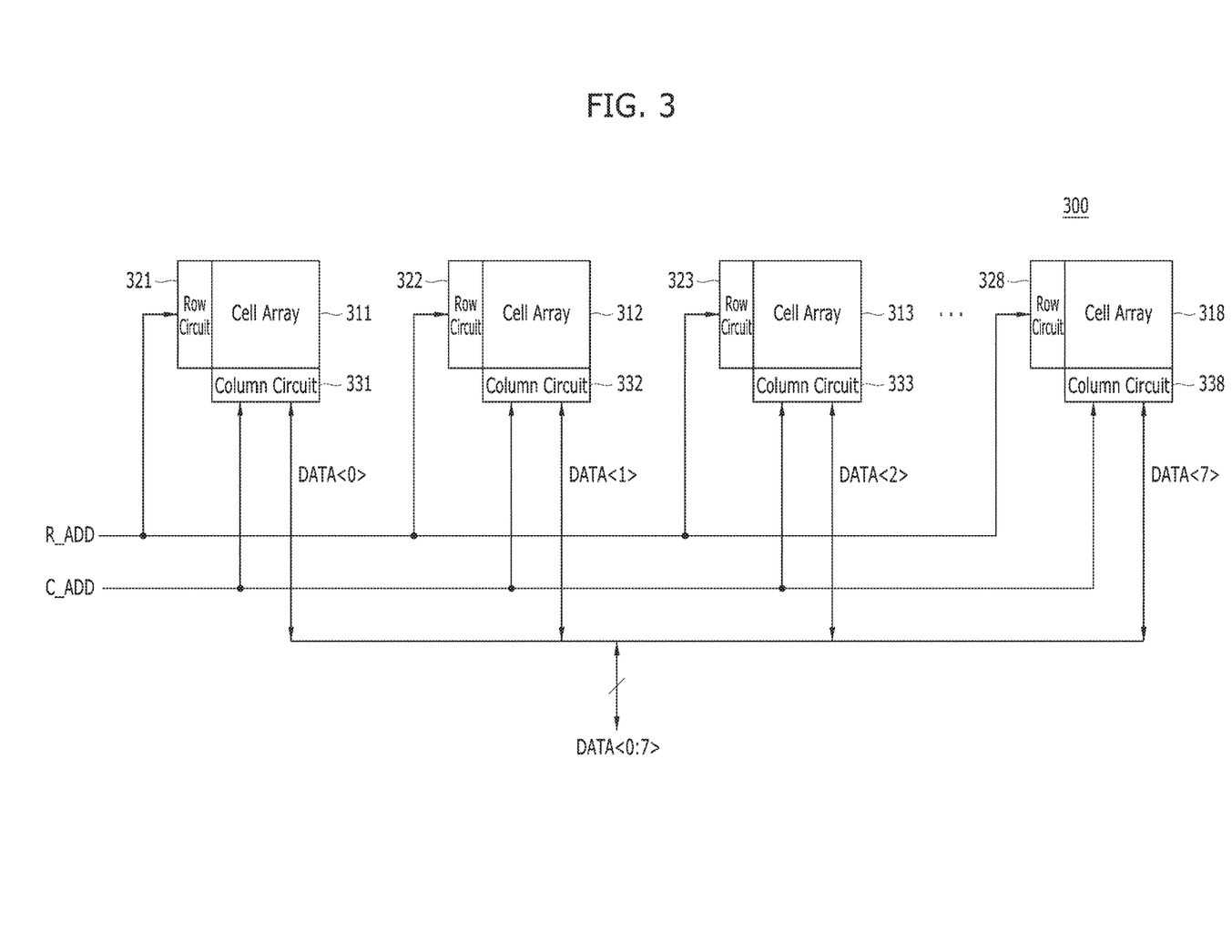
FIG. 3 is a block diagram illustrating an exemplary memory system.

FIG. 3 is a block diagram illustrating a memory system 300. The memory system 300 may be a memory module including a plurality of memory devices, or the memory system 300 may be a single memory device.

Referring to FIG. 3, the memory system 300 may include first to eighth cell arrays 311 to 318, first to eighth row circuits 321 to 328, and first to eighth column circuits 331 to 338.

It may be not common that there are many cases that only a single one-bit datum is read or written at a single read or write operation in the memory system 300. In most cases of a mass storage memory system, a data of multiple bits is read and written at a single read or write operation. By the way of example but not limitation, an 8-bit data DATA<0:7> may be read at a time during a read operation, and an 8-bit data DATA<0:7> may be written at a time during a write operation. When only one-bit data may be read and written in one cell array, eight cell arrays 311 to 318 are accessed simultaneously for reading and writing the 8-bit data DATA<0:7>.

The first to eighth cell arrays 311 to 318 may be accessed by the first to eighth row circuits 321 to 328 and the first to eighth column circuits 331 to 338. The first to eighth row circuits 321 to 328 receive the same row address R_ADD and the first to eighth column circuits 331 to 338 receive the same column address C_ADD. The first to eighth cell arrays 311 to 318 may, therefore, access a memory cell of the same position in each of the eight memory cell arrays 311 to 318. By the way of example but not limitation, when a memory cell at a position (0, 0) in the first cell array 311 is accessed (e.g., read or written), the memory cells located at a position (0, 0) of the second to eighth cell arrays 312 to 318 are accessed also at the same time. A position (0, 0) refers to a memory cell coupled to the zeroth row and zeroth column.

As explained above, the memory cells at a position (0, 0), because of their position closer to the row and column circuits are more vulnerable to cell damage due to disturbance and/or heat generation. Hence, when memory cells at a position (0, 0) in each of the first to eighth cell arrays 312 to 318 are read or written simultaneously, errors may occur at a plurality of bits among an 8-bit data DATA<0:7>. As a result, it may not be possible to correct the errors with the error correction scheme of the memory system 300 or the error correction scheme of a memory controller (not shown). On the other hand, when memory cells at a position of (7,7) in each of the first to eighth cell arrays 312 to 318 are accessed there may be no errors or very few errors. This is because memory cells at a position of (7, 7) have a lower (or lowest) possibility of errors based on their position. Hence, when memory cells at a position of (7, 7) in each of the first to eighth cell arrays 312 to 318 are read or written, errors may hardly occur in an 8-bit data DATA<0:7>.

Figure 4:
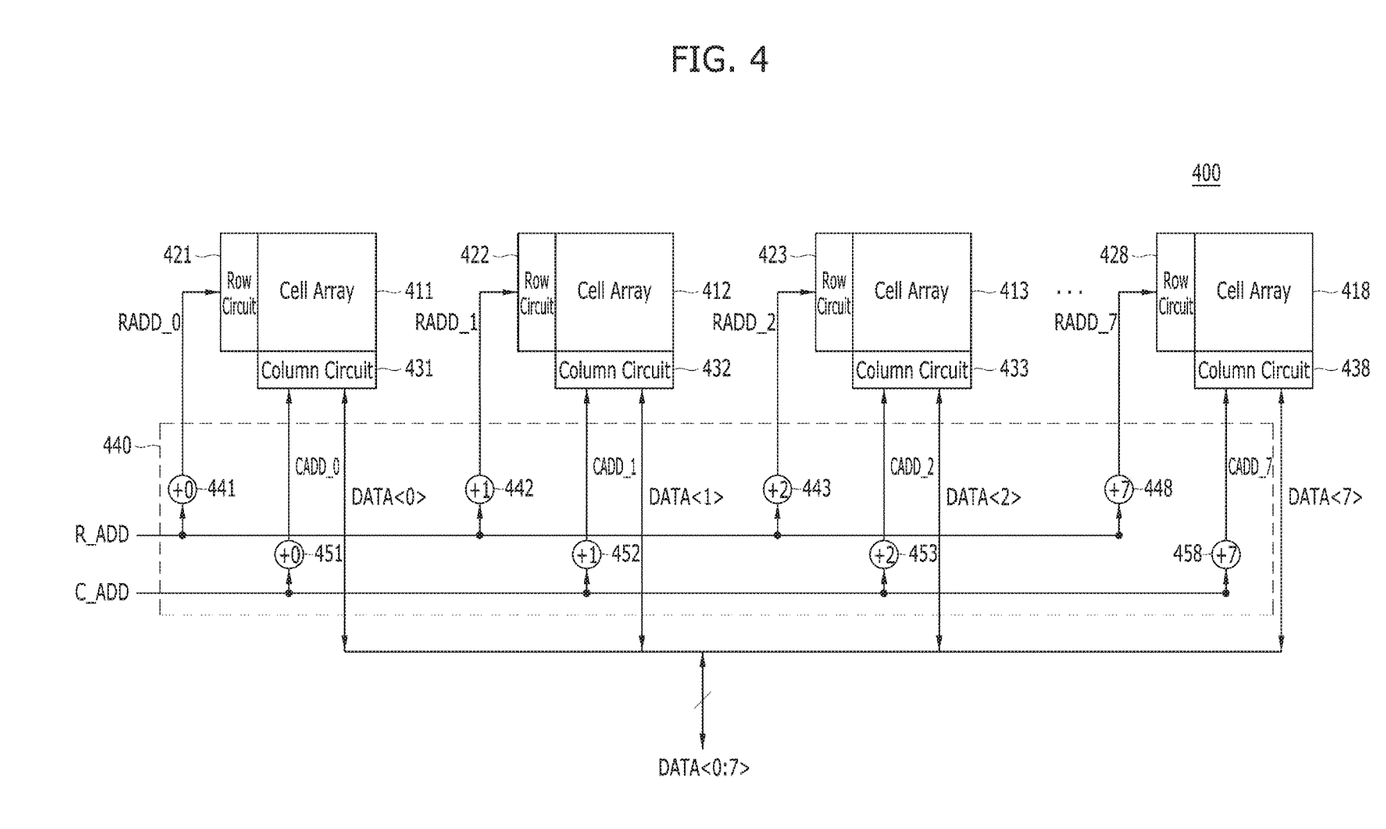
FIG. 4 is a block diagram illustrating another exemplary memory system.

FIG. 4 is a block diagram illustrating a memory system 400 in accordance with another example of the disclosure. The memory system 400 may be a memory module including a plurality of memory devices or the memory system 400 may be a single memory device.

Referring to FIG. 4, the memory system 400 may include first to eighth cell arrays 411 to 418, first to eighth row circuits 421 to 428, first to eighth column circuits 431 to 438, and an address operation circuit 440.

A multi-bit data DATA<0:7> may be written in or read from the first to eighth cell arrays 411 to 418 during a single write operation or a single read operation, respectively, performed in the memory system 400.

The address operation circuit 440 may generate the first to eighth cell array row addresses R_ADD_0 to and the first to eighth cell array column addresses C_ADD_0 to C_ADD7 for accessing the first to eighth cell arrays 411 to 418 from a row and a column address R_ADD and C_ADD, respectively. The first to eighth cell array row addresses R_ADD_0 to R_ADD_7 may be generated by the address operation circuit 440 by adding different values of 0 to 7 to the row address R_ADD. The first to eighth cell array column addresses C_ADD_0 to C_ADD7 may be generated by the address operation circuit 440 by adding different values of 0 to 7 to the column address C_ADD. By the way of example but not limitation, the address operation circuit 440 may generate first cell array addresses R_ADD_0, C_ADD_0 by adding the value of 0 to the addresses R_ADD, C_ADD, respectively. Likewise, the address operation circuit 440 may generate second cell array addresses R_ADD_1, C_ADD_1 by adding the value of 1 to the addresses R_ADD, C_ADD and generate third cell array addresses R_ADD_2, C_ADD_2 by adding the value of 2 to the addresses R_ADD, C_ADD and so on and so forth. In short, the address operation circuit 440 may generate the first to eighth cell array row addresses R_ADD_0 to R_ADD_7, and column addresses C_ADD_0 to C_ADD7 by adding each of the different values to each of the row address R_ADD, and column address C_ADD, respectively, delivered into each cell array. Here, the row address R_ADD and the column address C_ADD may be transferred from the memory controller to the memory system 400.

Herein, it is exemplarily illustrated that the address operation circuit 440 generates the first to eighth cell array row addresses R_ADD_0 to R_ADD_7 by adding different values to the row address R_ADD, while generating the first to eighth cell array column addresses C_ADD_0 to C_ADD7 by adding different values to the column address C_ADD. However, it should be understood by people skilled in the art of the invention that various other implementations are possible without departing from the scope of the disclosed inventive concepts. For example, in a variation of the illustrated example a memory system is provided having an address operation circuit generating first to eighth cell array row addresses R_ADD_0 to R_ADD_7, different from each other, by modifying entered row address R_ADD only without changing entered column address C_ADD. That is, the first to eight cell arrays 411 to 418 may be accessed by the same column address C_ADD with different row addresses R_ADD_0 to R_ADD_7. Another variation of the illustrated example provides a memory system having an address operation circuit configured to generate the first to eighth cell array column addresses C_ADD_0 to C_ADD_7, different from each other, by modifying inputted column address C_ADD only without changing inputted row address R_ADD. That is, the first to eight cell arrays 411 to 418 are controlled by the same row address R_ADD with different column addresses C_ADD_0 to C_ADD_7.

Referring back to FIG. 4 again, the address operation circuit 440 may include row adders 441 to 448 for generating the first to eighth cell array row addresses C_ADD_0 to C_ADD_7 by adding the different values to the row address R_ADD and column adders 451 to 458 for generating the first to eighth cell array column addresses C_ADD_0 to C_ADD_7 by adding the different values to the column address C_ADD.

The first to eighth cell arrays 411 to 418 may be accessed by the first to eighth row circuits 421 to 428 and the first to eighth column circuits 431 to 438. Also, since the first to eighth row circuits 421 to 428 receive the different row addresses R_ADD_0 to R_ADD_7, different rows in the first to eighth cell arrays 411 to 418 may be accessed. Since the first to eighth column circuits 431 to 438 receive different column addresses C_ADD_0 to C_ADD_7, different columns in the first to eighth cell arrays 411 to 418 may be accessed. In short, memory cells at different positions of each cell array 411 to 418 may be accessed (read and/or written) during a read operation or a write operation.

By the way of example but not limitation, when a memory cell at a position (0, 0) in the first cell array 431 is accessed by a single command, memory cells which are located at different positions in the different cell arrays may be accessed as follows:

a memory cell in a position (1,1) in the second cell array 432, a memory cell in a position (2,2) in the third cell array 433, a memory cell in a position (3,3) in the fourth cell array 434, a memory cell in a position (4,4) in the fifth cell array 435, a memory cell in a position (5,5) in the sixth cell array 436, a memory cell in a position (6,6) in the seventh cell array 437, and a memory cell in a position (7,7) in the eighth cell array 438.

Likewise, when a memory cell at a position (2,5) is accessed in the first cell array 431, memory cells which are located at different positions in the different cell arrays may be accessed as follows:

a memory cell in a position (3,6) in the second cell array 432, a memory cell in a position (4,7) in the third cell array 433, a memory cell in a position (5,0) in the fourth cell array 434, a memory cell in a position (6,1) in the fifth cell array 435, a memory cell in a position (7,2) in the sixth cell array 436, a memory cell in a position (0,3) in the seventh cell array 437, and a memory cell in a position (1,4) in the eighth cell array 438.

Since memory cells at different positions in the first to eighth cell arrays 431 to 438 are simultaneously accessed during a read operation or a write operation, memory cells of weak positions (e.g., (0, 0) position) in all of the cell arrays 431 to 438 may not be accessed simultaneously and, therefore, the error rate of data outputted from all of the cell arrays 431 to 438 may be reduced substantially. Therefore, the number of errors may be contained within the error correction capability of the error correction scheme of the memory system 400 and/or of the memory controller that controls the memory system 400.

As described above, the memory system 400 may be a single memory device or a memory module including a plurality of memory devices. When the memory system 400 is a single memory device, all the constituent elements shown in FIG. 4 may be included in one memory device. When the memory system 400 is a memory module, plural components, including the first to eighth cell arrays 411 to 418, the first to eighth row circuits 421 to 428, the first to eighth column circuits 431 to 438 and the address operation circuit 440, may be dispersedly and uniformly arranged in some devices, e.g., four memory devices or eight memory devices. Also, we note that the address operation circuit 440 may be included in the memory module, however, the present disclosure is not limited in this way, and in various other examples the address operation circuit 400 may be located outside of the memory devices included in the memory module. We further note, that the address operation circuit 440 may be implemented by tables for converting entered row and column addresses into actually used row and column addresses based on a predetermined modification scheme.

Although FIG. 4 illustrates as an example that eight cell arrays are included in the memory system 400 and each of the cell arrays includes 8×8 rows and columns, this is just an example. Hence, it is noted that the present disclosure may be implemented with a memory system including any different of cell arrays, e.g., more than eight. Also, it is noted that each of the cell arrays may include hundreds or thousands of rows and columns.

Characteristics of the memory cells may be different according to their positions in the cell arrays included within different types of memory devices and not just for resistive memory devices. Since simultaneously accessing plural memory cells at the different positions in a plurality of cell arrays may be advantageous or affirmative in all such memory devices, the example shown in FIG. 4 is applicable to all such different types of memory systems.

Figure 5:
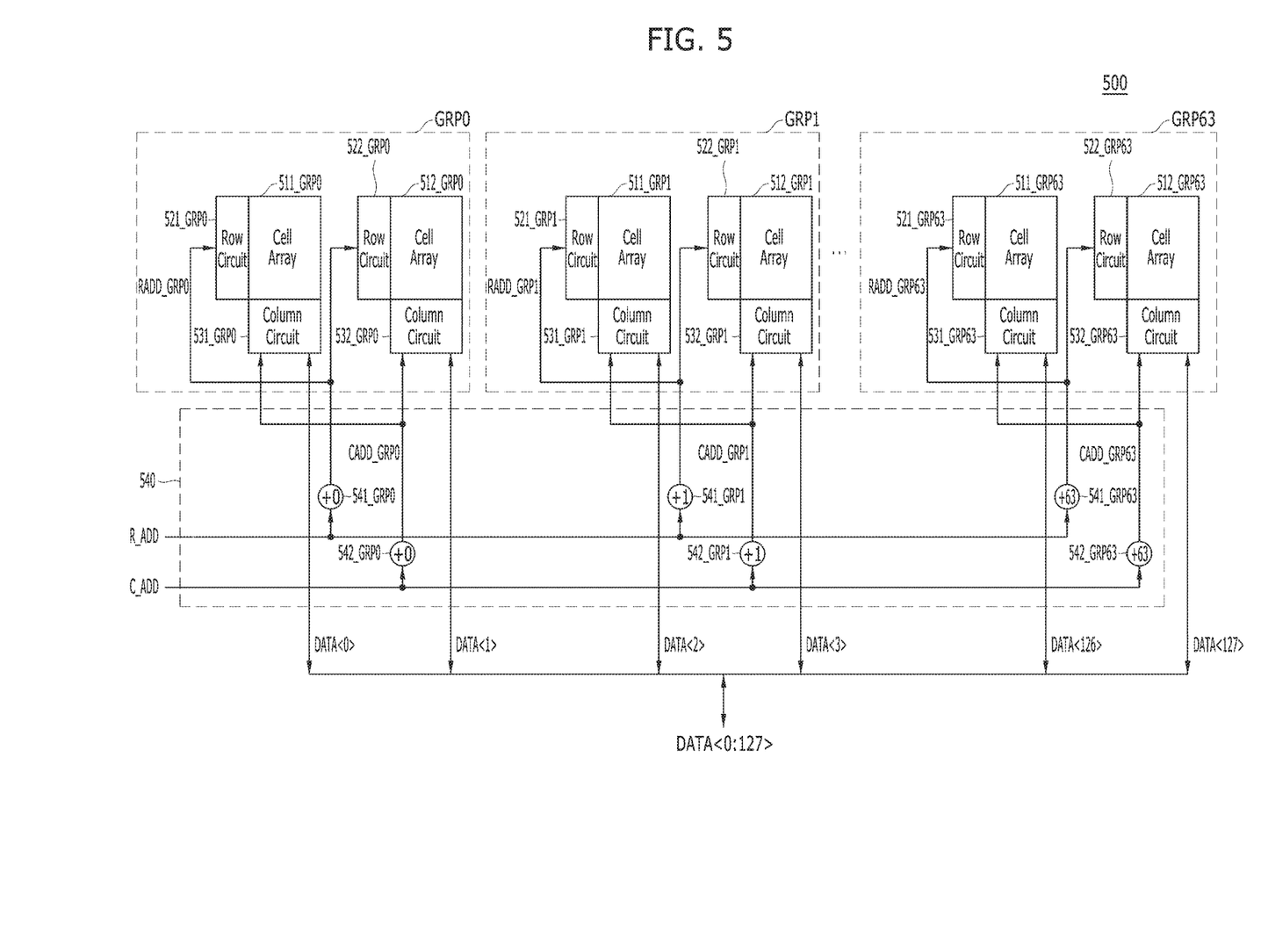
FIG. 5 is a block diagram illustrating another exemplary memory system.

FIG. 5 is a block diagram illustrating a memory system 500 in accordance with yet another example of the disclosure. The memory system 500 may be a memory module including a plurality of memory devices, or the memory system 500 may be a single memory device.

Referring to FIG. 5, the memory system 500 may include first to $64^{th}$ groups GRP0 to GRP63 and an address operation circuit 540. Each of the first to $64^{th}$ groups GRP0 to GRP63 may include two cell arrays 511_GRP0, 512_GRP0, . . . , 511_GRP63, 512_GRP63, two row circuits 521_GRP0, 522_GRP0, . . . , 521_GRP63, 522_GRP63, and two column circuits 531_GRP0, 532_GRP0, . . . , 531_GRP63, 532_GRP63.

A multi-bit data DATA<0:127> having 128 bits may be written in, or read from, the cell arrays 511_GRP0 to 511_GRP63, 512_GRP0 to 512_GRP63, which are 128 cell arrays, in the first to $64^{th}$ groups GRP0 to GRP63 during a read operation or a write operation of the memory system 500.

The address operation circuit 540 may generate the first to $64^{th}$ group addresses R_ADD_GRP0 to R_ADD_GRP63, C_ADD_GRP0 to C_ADD_GRP63 used in the first to $64^{th}$ groups GRP0 to GRP63 by adding different values of 0 to 63 to addresses R_ADD and C_ADD, respectively. By the way of example but not limitation, the address operation circuit 540 may generate sixth group addresses R_ADD_GRP5, C_ADD_GRP5 by adding the value of 5 to the addresses R_ADD, C_ADD, while generating $64^{th}$ group addresses R_ADD_GRP63, C_ADD_GRP63 by adding the value of 63 to the addresses R_ADD, C_ADD.

The address operation circuit 540 may include row adders 541_GRP0 to 541_GRP63 configured to generate the first to $64^{th}$ group row addresses R_ADD_GRP0 to R_ADD_GRP63 by adding different values to the row address R_ADD respectively, and column adders 542_GRP0 to 542_GRP63 configured to generate the first to $64^{th}$ group column addresses C_ADD_GRP0 to C_ADD_GRP63 by adding different values to the column addresses C_ADD respectively.

Herein, it is exemplarily illustrated that the address operation circuit 540 generates the first to $64^{th}$ group row addresses R_ADD_GRP0 to R_ADD_GRP63 by adding the different values to the row address R_ADD, and generates the first to $64^{th}$ group column addresses C_ADD_GRP0 to C_ADD_GRP63 by adding the different values to the column address C_ADD. However, it is likely that, in another example, the address operation circuit 540 modifies only the row address R_ADD without changing the column address C_ADD to generate the first to $64^{th}$ group row addresses R_ADD_GRP0 to R_ADD_GRP63. The first to $64^{th}$ groups GRP0 to GRP63 may be accessed by the same column address C_ADD with different row addresses R_ADD_GRP0 to R_ADD_GRP63 simultaneously. Further, in another example, the address operation circuit 540 may modify only the column address C_ADD without changing the row address R_ADD to generate the first to $64^{th}$ group column addresses C_ADD_GRP0 to C_ADD_GRP63. The first to $64^{th}$ groups GRP0 to GRP63 use the same row address R_ADD with different column addresses C_ADD_GRP0 to C_ADD_GRP63.

Since different addresses are used in the first to $64^{th}$ groups GRP0 to GRP63, during a read operation or a write operation of the first to $64^{th}$ groups GRP0 to GRP63, memory cells at different positions may be accessed in different groups. By the way of example but not limitation, when the memory cells at the position (1, 0) are accessed in the cell arrays of the first group GRP0, the memory cells of a position (3, 2) may be accessed in the cell arrays of the third group. Since the memory cells of different positions are accessed for the first to $64^{th}$ groups GRP0 to GRP63 during a read operation and a write operation, the memory cells of weak positions may not be accessed simultaneously in all the groups GRP0 to GRP63 so that it may be possible to avoid occurring a large number of errors on multi-bit data.

The memory system 500 may be a single memory device or a memory module including a plurality of memory devices. By the way of example but not limitation, all the constituent elements of FIG. 5 may be included in one memory device, or they may be included in different memory devices (e.g., 64 memory devices) for each of the groups GRP0 to GRP63, and the address operation circuit 540 may also be dispersedly disposed in the different memory devices.

Also, we note that simultaneously accessing memory cells at different positions in a plurality of cell arrays may be advantageous in different type memory devices which have memory cells with characteristics that may differ according to their positions in the cell arrays. Hence, the aforementioned example of FIG. 5 of the present disclosure may be applicable to such memory devices.

According to the aforementioned examples of the present disclosure, memory cells of different positions are accessed in a plurality of cell arrays, thus reducing substantially the occurrence of errors in a memory system.

While the present invention has been described with respect to the aforementioned specific examples, it will be apparent to those skilled in the art that various other examples, changes and modifications thereof may be made without departing from the spirit and scope of the invention as defined in the following claims.

What is claimed is:

1. A memory system, comprising:
a first cell array including a plurality of memory cells; and
a second cell array including a plurality of memory cells; and an address operation circuit suitable for generating a first cell array address, the first cell array address used for accessing at least one first cell in the first cell array, by adding a first value to an address, and generating a second cell array address, the second cell array address used for accessing at least one second cell in the second cell array, by adding a second value to the address.

2. The memory system of claim 1, wherein the first cell array and the second cell array are accessed simultaneously in response to the address.

3. The memory system of claim 1, wherein each of the address, the first cell array address, and the second cell array address includes at least one of a row address and a column address.

4. The memory system of claim 1, wherein each of the address, the first cell array address, and the second cell array address includes a row address and a column address, and
the address operation circuit generates a row address of the first cell array address by adding the first value to a row address of the address and generates a column address of the first cell array address by adding the first value to a column address of the address, and generates a row address of the second cell array address by adding the second value to the row address of the address and generates a column address of the second cell array address by adding the second value to the column address of the address.

5. The memory system of claim 1, wherein the first cell array and the second cell array are included in a memory device.

6. The memory system of claim 1, wherein the first cell array and the second cell array are included in different memory devices.

7. The memory system of claim 1, wherein the address operation circuit includes at least two adders.

8. The memory system of claim 1,
wherein the address is transferred from a memory controller to the address operation circuit, and
wherein the memory cells are resistive memory cells.

9. The memory system of claim 2, wherein a position of a memory cell that is accessed based on the first cell array address in the first cell array is different from a position of a memory cell that is accessed based on the second cell array address in the second cell array.

10. A memory system, comprising:
a first group that includes two or more cell arrays;
a second group that includes two or more cell arrays; and
an address operation circuit suitable for generating a first group address for accessing at least one first cell in the first group, by adding a first value to an address, and generating a second group address for accessing at least one second cell in the second group, by adding a second value to the address.

11. The memory system of claim 10, wherein the first group and the second group are accessed simultaneously in response to the address.

12. The memory system of claim 10, wherein each of the address, the first group address, and the second group address includes a row address.

13. The memory system of claim 10, wherein each of the address, the first group address, and the second group address includes a column address.

14. The memory system of claim 10, wherein each of the address, the first group address, and the second group address includes a row address and a column address, and
the address operation circuit generates a row address of the first group address by adding the first value to a row address of the address and generates a column address of the first group address by adding the first value to a column address of the address, and generates a row address of the second group address by adding the second value to the row address of the address and generates a column address of the second group address by adding the second value to the column address of the address.

15. The memory system of claim 10, wherein the first group and the second group are included in a memory device.

16. The memory system of claim 10, wherein the first group and the second group are included in different memory devices.

17. The memory system of claim 10, wherein positions of memory cells that are accessed based on the first group address in the cell arrays of the first group is different from positions of memory cells that are accessed based on the second group address in the cell arrays of the second group.

18. The memory system of claim 10, wherein the address is transferred from a memory controller to the address operation circuit.

19. The memory system of claim 10, further comprising:
an error correction circuit suitable for correcting an error of data that are read from the first group and the second group.

20. A memory system, comprising:
at least one memory device including plural cell arrays;
a controller suitable for performing a single operation on the at least one memory device for storing or outputting a multi-bit data, wherein the number of cell arrays in the at least one memory device is an integer multiple of the number of bits in the multi-bit data; and
an address operation circuit suitable for converting a cell address entered with a command for the single transaction into different converted cell addresses and providing each converted cell addresses into each cell array.

* * * * *